(12) United States Patent
Liang

(10) Patent No.: US 7,220,142 B2
(45) Date of Patent: May 22, 2007

(54) ELECTRONIC APPARATUS WITH RETAINING MEMBER

(75) Inventor: Jen-Yu Liang, Tu-Cheng (TW)

(73) Assignee: Hon Hai Precision Industry Co., Ltd., Tu-Chen, Taipei Hsien (TW)

( * ) Notice: Subject to any disclaimer, the term of this patent is extended or adjusted under 35 U.S.C. 154(b) by 0 days.

(21) Appl. No.: 11/313,346

(22) Filed: Dec. 20, 2005

(65) Prior Publication Data

US 2007/0032116 A1 Feb. 8, 2007

(30) Foreign Application Priority Data

Aug. 5, 2005 (CN) .................. 2005 1 0036411

(51) Int. Cl.
*H01R 13/62* (2006.01)

(52) U.S. Cl. ..................... 439/326; 439/328

(58) Field of Classification Search ............... 439/326, 439/327, 328, 64, 571, 564, 567
See application file for complete search history.

(56) References Cited

U.S. PATENT DOCUMENTS

| | | | | |
|---|---|---|---|---|
| 4,550,362 A | * | 10/1985 | Reimer | 361/801 |
| 4,712,848 A | * | 12/1987 | Edgley | 439/327 |
| 5,088,929 A | * | 2/1992 | Enomoto | 439/66 |
| 5,897,393 A | * | 4/1999 | Haftmann | 439/495 |
| 6,183,284 B1 | * | 2/2001 | Gill et al. | 439/327 |
| 6,215,673 B1 | * | 4/2001 | Gordon et al. | 361/801 |
| 6,540,550 B2 | | 4/2003 | Chang et al. | 439/541.5 |
| 6,549,425 B1 | * | 4/2003 | Kosugi | 361/809 |
| 6,843,675 B2 | * | 1/2005 | Yamashita | 439/329 |
| 6,955,554 B2 | * | 10/2005 | Korsunsky et al. | 439/328 |

* cited by examiner

*Primary Examiner*—Hien Vu
(74) *Attorney, Agent, or Firm*—Morris Manning & Martin LLP; Tim Tingkang Xia, Esq.

(57) ABSTRACT

An electronic apparatus includes a circuit board (10), a connector (20) disposed on the circuit board, an electronic component (30) electrically connected to the connector, and a retaining member (40). The circuit board defines a hole (12). The retaining member includes a positioning portion (44), and a pressing portion (42) connecting with the positioning portion. The pressing portion includes a pair of resilient pressing arms (426) pressing against the electronic component and holding it in position. The positioning portion comprises a locating post (444) engagingly received in the hole of the circuit board. The locating post includes a resilient hook (446). The hook is retractable, so that the locating post can be easily passed through the hole of the circuit board. Thus, the retaining member can be easily attached to or removed from the assembly.

14 Claims, 4 Drawing Sheets

ELECTRONIC APPARATUS WITH RETAINING MEMBER

BACKGROUND

1. Field of the Invention

The present invention pertains to electronic apparatuses that include circuit boards; and particularly to an electronic apparatus with a retaining member, which can be used for securely mounting an electronic component on a circuit board.

2. General Background

Electronic apparatuses, such as access points, mobile phones, notebooks, and so on, are becoming ever more popular. In typical electronic apparatuses, electronic components such as network cards, memory cards, and so on are necessary elements for transmitting and receiving data. Generally, the electronic components are disposed on a circuit board of the electronic apparatus.

Referring to FIG. 5, this is an isometric view of part of a conventional electronic apparatus 60. The electronic apparatus 60 comprises a circuit board 62, a connector 64, and an electronic component 66. The connector 64 comprises a pair of protrusions 642 protruding from a pair of opposite sidewalls thereof. A pair of cutouts 662 is defined in opposite sidewalls of the electronic component 66, corresponding to the protrusions 642 of the connector 64. The protrusions 642 can be engaged in the cutouts 662, whereby the electronic component 66 is attached to the connector 64. In assembly, the connector 64 is mounted on the circuit board 62. The electronic component 66 is electrically connected to the connector 64, with the protrusions 642 of the connector 64 being engagingly received in the cutouts 662 of the electronic component 66.

The electronic component 66, however, may still be easily displaced or disengaged from the connector 64 during operation or transportation of the electronic apparatus 60. When the electronic component 66 is detached from the connector 64, the electronic component 66 loses its ability to transmit and receive data. Consequently, the electronic apparatus 60 cannot function properly or may fail altogether.

Therefore, a heretofore unaddressed need exists in the industry to overcome the aforementioned deficiencies and inadequacies.

SUMMARY

In an exemplary embodiment, an electronic apparatus comprises a circuit board, a connector, an electronic component, and a retaining member. The circuit board comprises a hole. The connector is mounted on the circuit board. The electronic component is electrically connected to the connector. The retaining member comprises a positioning portion engagingly received in the hole of the circuit board, and a pressing portion connecting with the positioning portion. The pressing portion comprises a pair of resilient pressing arms pressing against the electronic component and holding it in position. The positioning portion comprises a locating post engagingly received in the hole of the circuit board. The locating post comprises a resilient hook. The hook is retractable, so that the locating post can be easily passed through the hole of the circuit board in assembly. Thus, the retaining member can be easily attached to or removed from the assembly.

Other advantages and novel features will become more apparent from the following detailed description when taken in conjunction with the accompanying drawings, in which:

DETAILED DESCRIPTION OF THE EMBODIMENT

Figure 1:
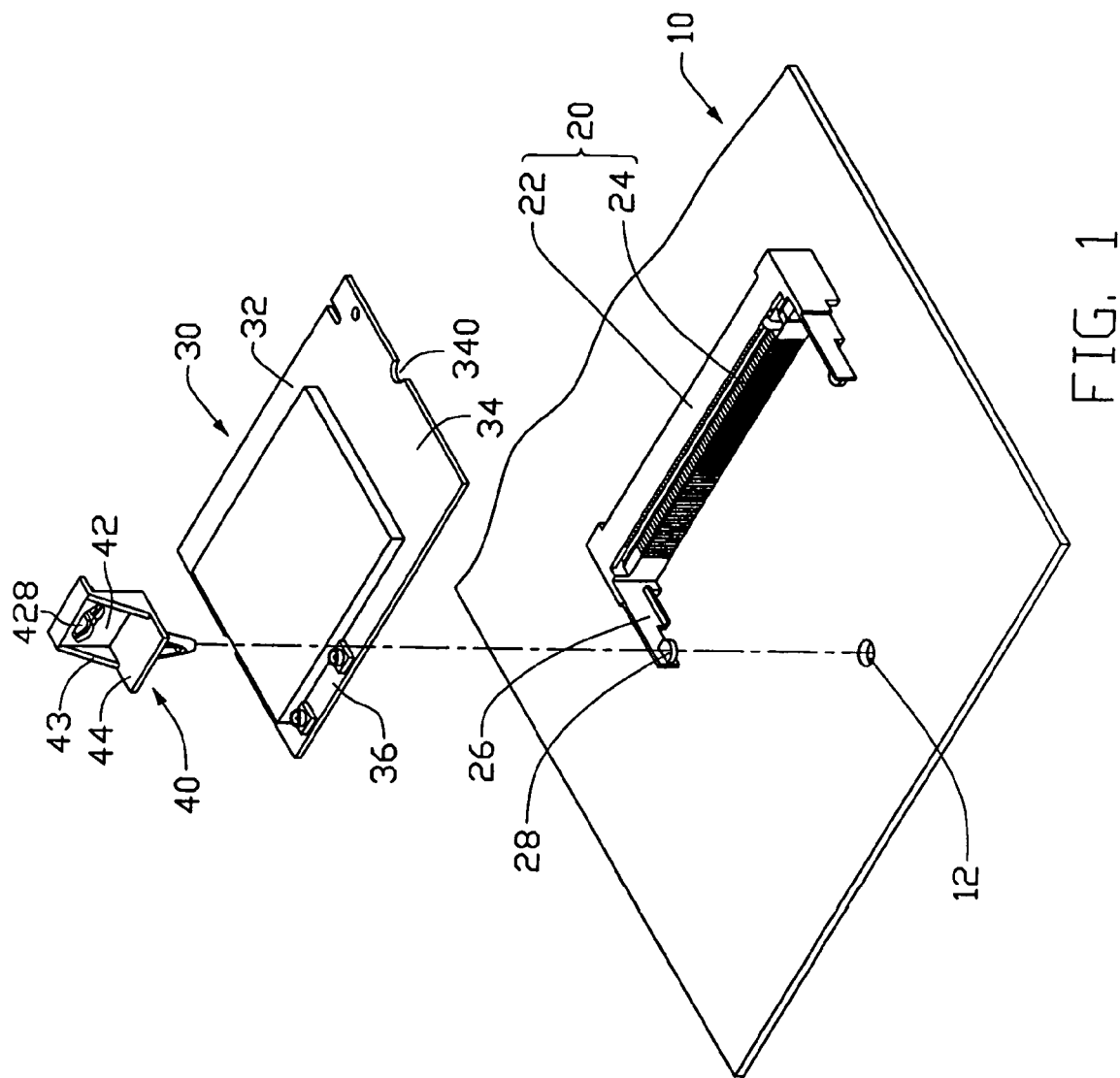
FIG. 1 is an exploded, isometric view of part of an electronic apparatus of an exemplary embodiment of the present invention.

Referring to FIG. 1, an electronic apparatus installed in an electronic device like a computer of an exemplary embodiment of the present invention comprises a circuit board 10, a connector 20, an electronic component 30, and a retaining member 40.

A hole 12 is defined in the circuit board 10, for mounting of the retaining member 40 thereat.

The connector 20 is mounted on the circuit board 10. The connector 20 comprises a housing 22, and a plurality of terminals 24 received in the housing 22. The housing 22 comprises a pair of opposite sidewalls 26. A semicircular protrusion 28 protrudes from an inner face of an end portion of each of the sidewalls 26.

The electronic component 30 may be a network card, a memory card, etc. The electronic component 30 comprises a first wall 32, a pair of opposite second walls 34, and a third wall 36 opposite to the first wall 32. The second walls 34 perpendicularly interconnect the first wall 32 and the third wall 36. The first wall 32 comprises a plurality of gold fingers (not shown) corresponding to the terminals 24 of the connector 20. A semicircular cutout 340 is defined in each of the second sidewalls 34, the cutouts 340 corresponding to the protrusions 28 of the connector 20.

Figure 2:
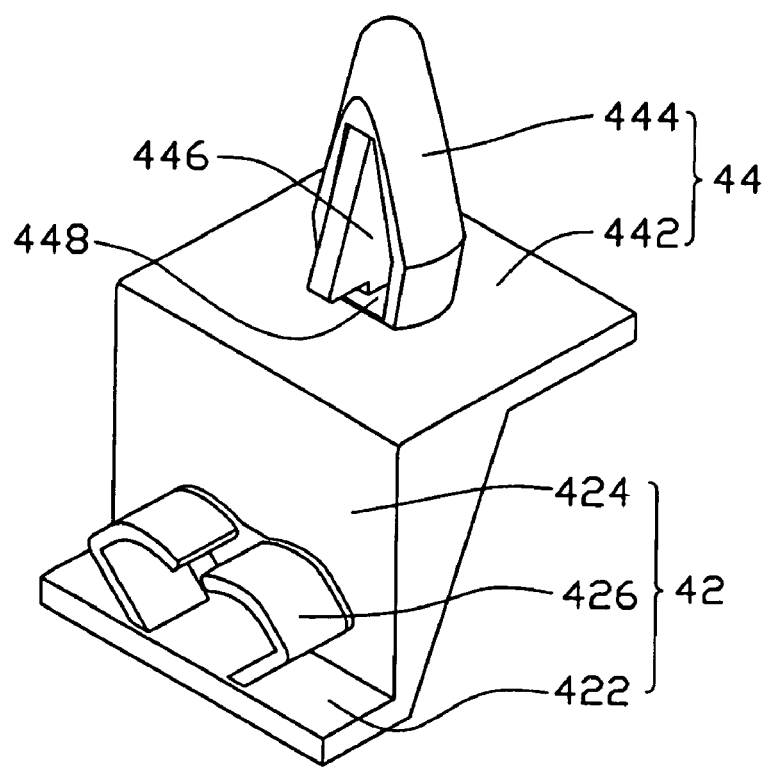
FIG. 2 is an enlarged, inverted, isometric view of a retaining member of the electronic apparatus of FIG. 1.
Figure 3:
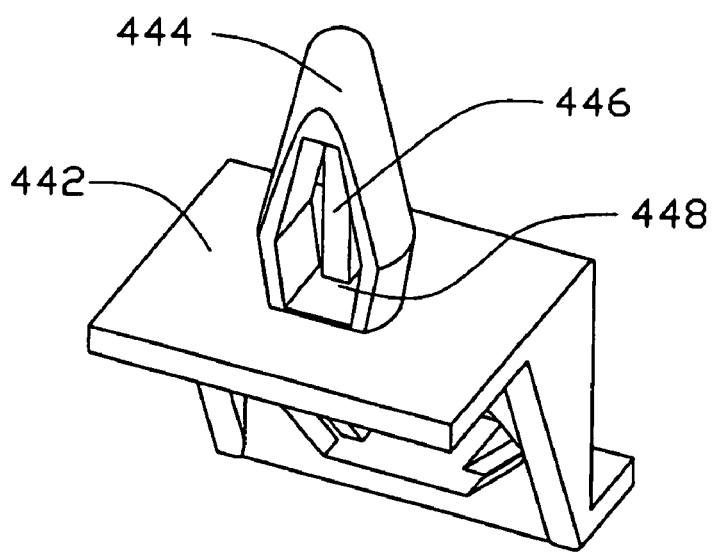
FIG. 3 is similar to FIG. 2, but viewed from another direction.

Referring also to FIGS. 2 and 3, the retaining member 40 comprises a positioning portion 44, a pressing portion 42, and a pair of opposite rib portions 43. The positioning portion 44 is perpendicularly connected to the pressing portion 42. The pressing portion 42 comprises a first board 422, a second board 424, and a pair of symmetrically opposite, elastically deformable pressing arms 426. The second board 424 is perpendicularly connected to the first board 422 and the positioning portion 44. The pressing arms 426 are used for pressing against the electronic component 30 to keep it in position. Each pressing arm 426 is generally L-shaped, and extends down from a bottom face of the first board 422. A through-hole 428 is defined in the second board 424, for facilitating forming of the pressing arms 426. The through-hole 428 is adjacent to the first board 422.

The positioning portion 44 comprises a third board 442, and a locating post 444 for attaching the retaining member 40 to the circuit board 10. The third board 442 is perpendicularly connected to the second board 424 of the pressing portion 42. The locating post 444 is disposed at a center of a bottom face of the third board 442, and has a generally A-shaped profile. The locating post 444 has a maximum diameter generally equal to or slightly smaller than a diameter of the hole 12 of the circuit board 10. The locating post 444 comprises a receiving hole 448 defined in a center thereof. A resilient hook 446 extends up from a bottom portion of the locating post 444, and terminates near a bottom face of the third board 442. The hook 446 is generally A-shaped, and is resiliently retractable into the locating post 444. Each rib portion 43 has a generally triangular shape, and integrally interconnects the positioning portion 44 and the pressing portion 42. The rib portions 43 thus reinforce the retaining member 40.

Figure 4:
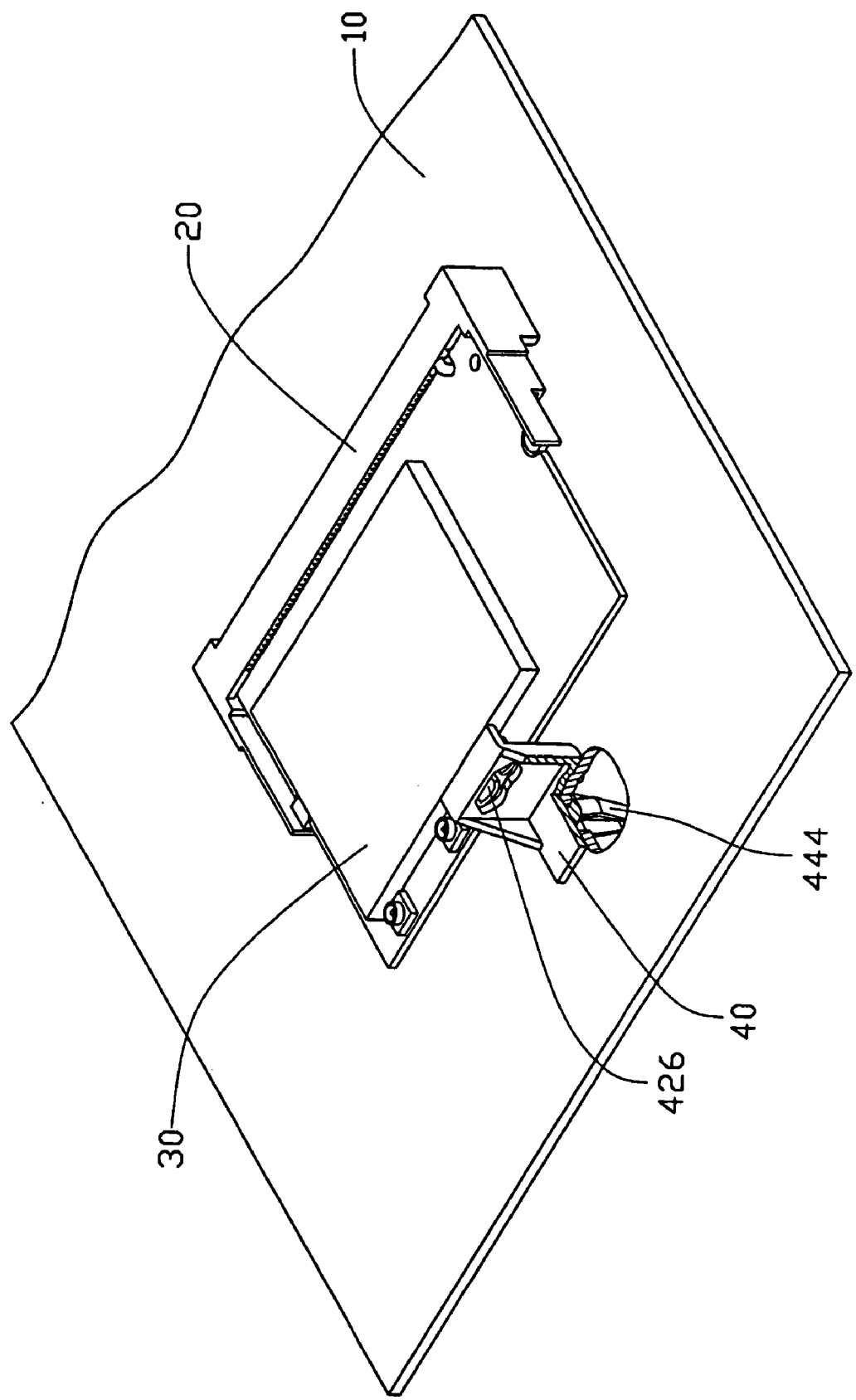
FIG. 4 is an assembled, partially cutaway view of FIG. 1.
Figure 5:
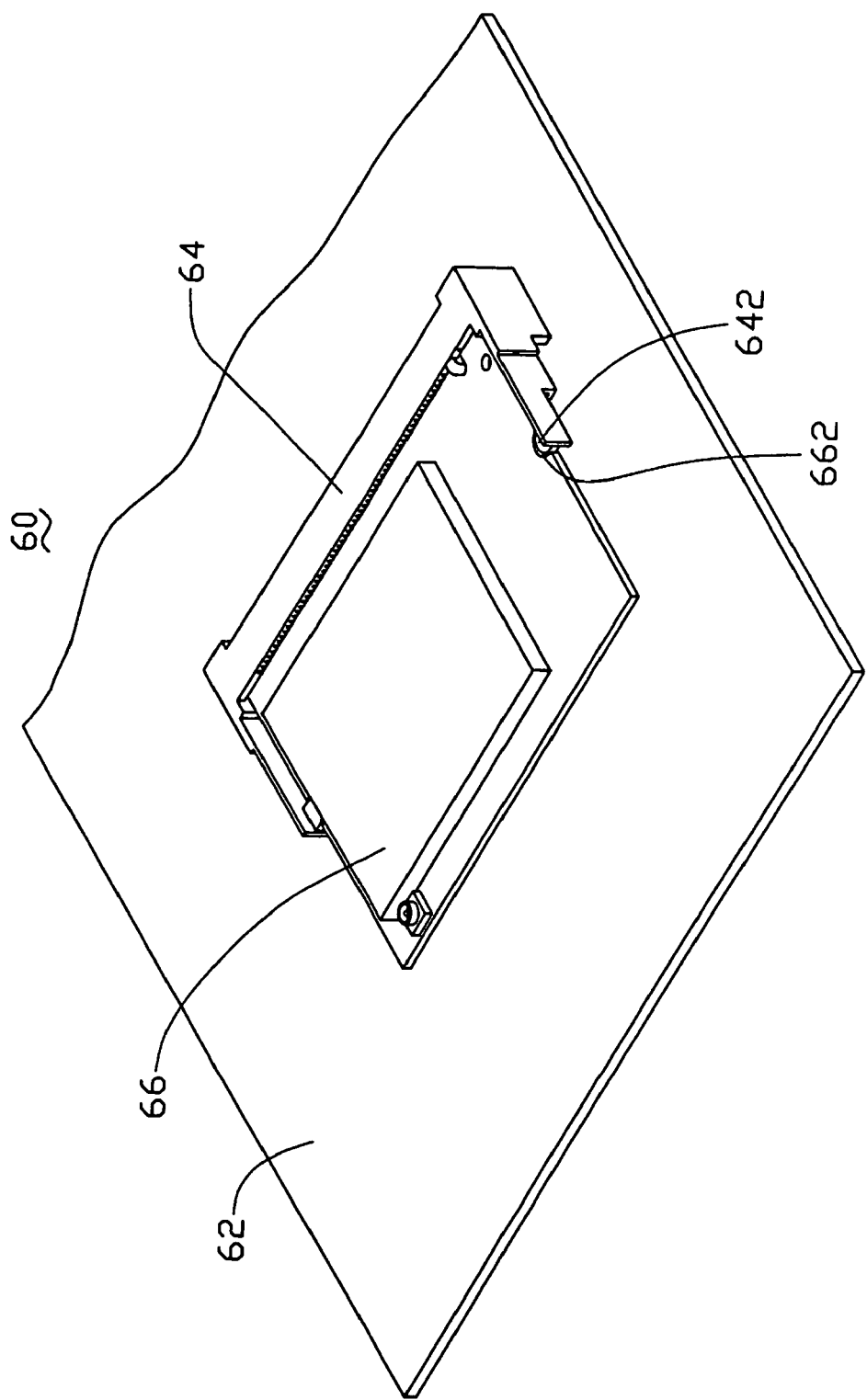
FIG. 5 is an isometric view of part of a conventional electronic apparatus.

Referring also to FIG. 4, in assembly, the connector 20 is mounted on the circuit board 10. The electronic component 30 is mounted to the connector 20, with the gold fingers of the electronic component 30 electrically connecting to the terminals 24 of the connector 20, and the protrusions 28 of the connector 20 being engagingly received in the cutouts 340 of the electronic component 30. The locating post 444 of the retaining member 40 is engaged in the hole 12 of the circuit board 10, with the pressing arms 426 resiliently pressing the third sidewall 36 of the electronic component 30. Thereby, the electronic component 30 is stably mounted on the circuit board 10. In this position, the hook 446 protrudes from the receiving hole 448, and abuts against a bottom face of the circuit board 10. Thus, the electronic component 30 is stably attached to the connector 20 and fixed on the circuit board 10 by the retaining member 40.

Once the electronic component 30 is stably attached and fixed as described above, the electronic component 30 does not easily detach from the connector 20 during operation or transportation of the electronic apparatus. In addition, even if the electronic apparatus should fall to the floor from a desk or table, the electronic component 30 can remain engaged with the connector 20. This can help ensure continued data transmission and proper functioning of the electronic apparatus.

The pressing arms 426 are flexible, and can variably deform according to a height or depth of the particular electronic component 30 used. Therefore, the retaining member 40 can securely mount electronic components of various sizes on the circuit board 10.

Because the hook 446 of the locating post 444 is retractable, the locating post 444 can be easily passed through the hole 12 of the circuit board 10. Thus, the retaining member 40 can be easily attached to or removed from the assembly.

While an exemplary embodiment has been described above, it is understood that it has been presented by way of example only and not by way of limitation. The scope of the present invention should not be limited by the exemplary embodiment, but shall be defined only in accordance with the following claims and their equivalents.

I claim:

1. An electronic apparatus, comprising:
    a circuit board comprising a hole;
    a connector mounted on the circuit board;
    an electronic component electrically connected to the connector; and
    a retaining member comprising a positioning portion extending toward the circuit board to be partly received in the hole of the circuit board for locating the retaining member onto the circuit board, and a pressing portion comprising a first board forming at least one pressing arm at a bottom thereof extending along the same direction as the positioning portion toward the circuit board for resiliently pressing the electronic component toward the circuit board, and a second board perpendicularly connecting with the first board, the second board defining a through hole adjacent to the first board.

2. The electronic apparatus as claimed in claim 1, wherein the retaining member further comprises a pair of rib portions interconnecting the positioning portion and the pressing portion.

3. The electronic apparatus as claimed in claim 1, wherein the at least one pressing arm includes two pressing arms, and each of the two pressing arms is generally L-shaped and elastically deformable.

4. The electronic apparatus as claimed in claim 1, wherein the positioning portion comprises a third board perpendicularly connecting with the second board, and a locating post disposed at a bottom of the third board and received in the hole of the circuit board.

5. The electronic apparatus as claimed in claim 4, wherein the locating post has a generally A-shaped profile.

6. The electronic apparatus as claimed in claim 4, wherein the locating post comprises a hook extending from a bottom portion thereof and terminating near the third board.

7. The electronic apparatus as claimed in claim 6, wherein the hook is retractable and generally A-shaped.

8. A retaining member for fixing an electronic component on a circuit board that comprises a hole, the retaining member comprising:
    a positioning portion extending-toward the circuit board and configured for being partly engaged in the hole of the circuit board; and
    a pressing portion connecting with the positioning portion, and extending from the positioning portion toward the circuit board for pressing the electronic component toward the circuit board and holding the electronic component in place;
    wherein the pressing portion comprises a first board, a second board, and a pair of pressing arms, the first board is connected perpendicular to the second board, the pressing arms are disposed on a bottom of the first board toward the circuit board for pressing the electronic component, and the positioning portion comprises a third board connected perpendicularly with the second board, and a locating post disposed at a bottom of the third board.

9. The retaining member as claimed in claim 8, wherein each pressing arm is generally L-shaped and elastically deformable.

10. The retaining member as claimed in claim 8, wherein the second board defines a through hole adjacent to the first board.

11. The retaining member as claimed in claim 8, wherein the locating post has a generally A-shaped profile.

12. The retaining member as claimed in claim 11, wherein the locating post comprises a hook extending from a bottom portion thereof and terminating near the third board.

13. The retaining member as claimed in claim 12, wherein the hook is retractable and generally A-shaped.

14. An electronic device comprising:
    a circuit board installable in an electronic device;
    an electronic component electrically connectable with said circuit board via an electrical connector supportively mounted along a side of said component for extension of said circuit board; and
    a retaining member separately installable onto said circuit board beside said component along another side other than said mounting side of said component for said electrical connector, said retaining member capable of restraining movement of said component relative to said circuit board along at least two directions at said another side of said component when said component is electrically connected with said circuit board via said electrical connector, said retaining member comprising a positioning portion extending toward said circuit board and engaging therewith for locating said retaining member onto said circuit board, a hook retractably formed from said positioning portion for abutting against said circuit board, and a pressing portion connecting with said positioning portion, wherein said positioning portion comprises a board perpendicularly connecting with said pressing portion, and a locating post disposed at a bottom of said board, and said hook extends from a bottom portion of said locating post and terminates near said board so as to be retractable.

* * * * *